(12) United States Patent
Erickson et al.

(10) Patent No.: US 9,685,526 B2
(45) Date of Patent: *Jun. 20, 2017

(54) SIDE GATE ASSIST IN METAL GATE FIRST PROCESS

(71) Applicant: International Business Machines Corporation, Armonk, NY (US)

(72) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/178,511

(22) Filed: Feb. 12, 2014

(65) Prior Publication Data

US 2015/0228757 A1   Aug. 13, 2015

(51) Int. Cl.
| | |
|---|---|
| *H01L 29/66* | (2006.01) |
| *H01L 29/78* | (2006.01) |
| *H01L 29/423* | (2006.01) |
| *H01L 21/28* | (2006.01) |
| *H01L 29/49* | (2006.01) |
| *H01L 29/165* | (2006.01) |

(52) U.S. Cl.
CPC .. *H01L 29/66484* (2013.01); *H01L 21/28035* (2013.01); *H01L 29/4238* (2013.01); *H01L 29/4983* (2013.01); *H01L 29/6659* (2013.01); *H01L 29/7833* (2013.01); *H01L 29/165* (2013.01)

(58) Field of Classification Search
CPC ....... H01L 21/28; H01L 29/66; H01L 29/423; H01L 21/28035; H01L 29/42; H01L 29/4238; H01L 29/49; H01L 29/4983; H01L 29/6659; H01L 29/66484; H01L 29/78; H01L 29/7833
See application file for complete search history.

(56) References Cited

U.S. PATENT DOCUMENTS

| | | | |
|---|---|---|---|
| 6,051,470 A | 4/2000 | An et al. | |
| 6,312,995 B1 | 11/2001 | Yu | |
| 6,991,973 B2 * | 1/2006 | Chang et al. | 438/149 |

(Continued)

*Primary Examiner* — Fazli Erdem

(74) *Attorney, Agent, or Firm* — Wood, Herron & Evans, LLP; Robert R. Williams

(57) ABSTRACT

A method of making a semiconductor device in a gate first process with side gate assists. A first gate may be formed within a gate region. The first gate may include a first gate conductor separated from a semiconductor substrate by a first insulator disposed between the first gate conductor and the semiconductor substrate. A second gate may be formed within the gate region. The second gate may include a second gate conductor separated from a vertical surface of the first gate conductor and the semiconductor substrate by a second insulator. A first electrical contact and a second electrical contact may be formed. The first and second electrical contacts may be disposed on opposite ends of the gate region for respectively connecting the first gate conductor and the second gate conductor to a respective voltage.

14 Claims, 9 Drawing Sheets

(56) References Cited

U.S. PATENT DOCUMENTS

| | | |
|---|---|---|
| 7,659,157 B2 | 2/2010 | Greene et al. |
| 7,915,123 B1 | 3/2011 | Lee et al. |
| 2001/0041438 A1 | 11/2001 | Maeda et al. |
| 2002/0197810 A1 | 12/2002 | Hanafi et al. |
| 2004/0137689 A1* | 7/2004 | Dokumaci ........ H01L 21/28105 438/305 |
| 2005/0145959 A1* | 7/2005 | Forbes et al. ................. 257/412 |
| 2008/0038924 A1* | 2/2008 | Rachmady et al. .......... 438/704 |
| 2009/0032889 A1* | 2/2009 | Zhu .................... H01L 21/28105 257/410 |
| 2011/0272753 A1 | 11/2011 | Funayama et al. |
| 2012/0161230 A1* | 6/2012 | Satoh ................ H01L 29/66681 257/335 |
| 2013/0341720 A1* | 12/2013 | Erickson ............ H01L 29/4238 257/347 |
| 2015/0188063 A1* | 7/2015 | Takeya ............... H01L 51/0554 257/40 |

\* cited by examiner

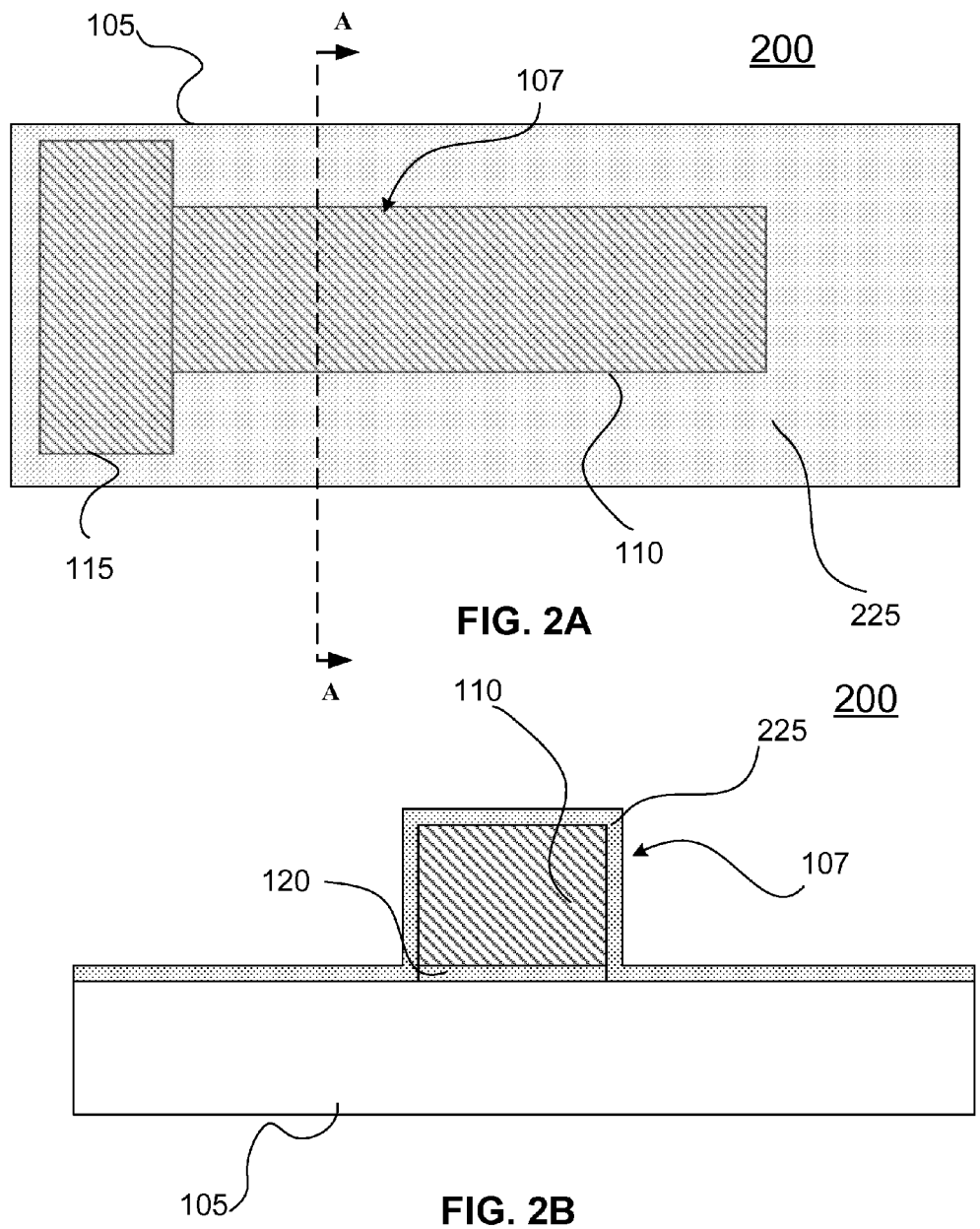

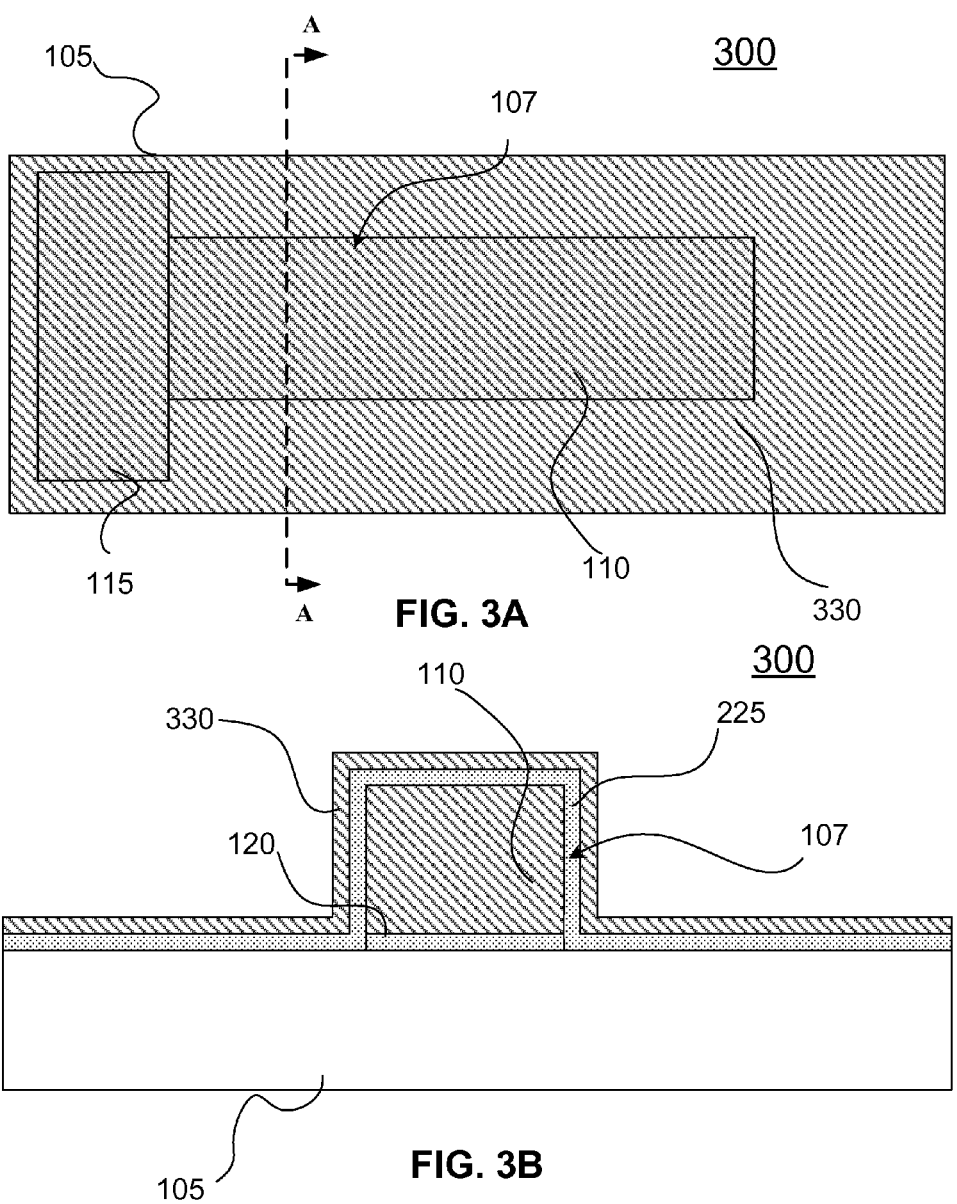

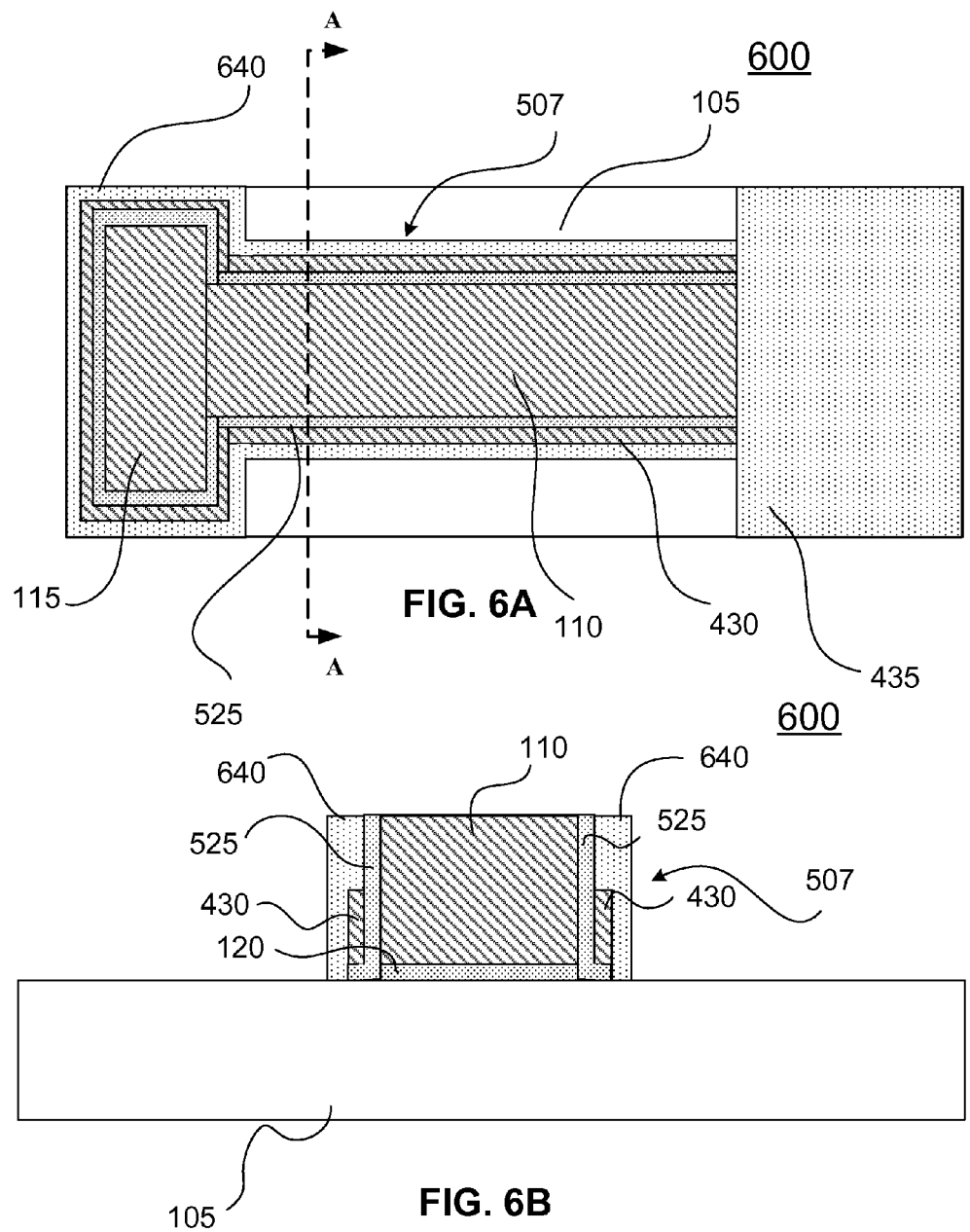

US 9,685,526 B2

SIDE GATE ASSIST IN METAL GATE FIRST PROCESS

BACKGROUND

The present disclosure relates to the data processing field, and more specifically, relates to a method and semiconductor device for implementing field effect transistors (FETs) having a side gate assist in metal gate first process.

A semiconductor device is a component of most electronic systems. Field effect transistors (FETs) have been the dominant semiconductor technology used to make application specific integrated circuit (ASIC) devices, microprocessor devices, static random access memory (SRAM) devices, and the like, for many years. In particular, complementary metal oxide semiconductor (CMOS) technology has dominated the semiconductor process industry.

Technology advances have scaled FETs on semiconductor devices to small dimensions allowing power per logic gate to be dramatically reduced, and further allowing a very large number of FETs to be fabricated on a single semiconductor device. However, traditional FETs are reaching their physical limitations as their size decreases.

SUMMARY

According to embodiments of the present disclosure, an embodiment is a method of making a semiconductor device in a gate first process with side gate assists. A first gate may be formed within a gate region. The first gate may include a first gate conductor separated from a semiconductor substrate by a first insulator disposed between the first gate conductor and the semiconductor substrate. A second gate may be formed within the gate region. The second gate may include a second gate conductor separated from a vertical surface of the first gate conductor and the semiconductor substrate by a second insulator disposed between the second gate conductor and both the semiconductor substrate and the vertical surface of the first gate conductor inside the gate region. A first electrical contact and a second electrical contact may be formed. The first and second electrical contacts may be disposed on opposite ends of the gate region for respectively connecting the first gate conductor and the second gate conductor to a respective voltage.

In other embodiments, a design structure of the semiconductor device is described. The design structure includes a semiconductor device for implementing a field effect transistor (FET) utilizing first gate process. The semiconductor device includes a first gate formed within a gate region. The first gate includes a first gate conductor separated from a semiconductor substrate by a first insulator disposed between the first gate conductor and the semiconductor substrate. The design structure further includes a second gate within the gate region. The second gate includes a second gate conductor separated from a vertical surface of the first gate conductor and the semiconductor substrate by a second insulator disposed between the second gate conductor and both the semiconductor substrate and the vertical surface of the first gate conductor inside the gate region. The semiconductor device further includes a first electrical contact and a second electrical contact disposed on opposite ends of the gate region for respectively electrically connecting the first gate conductor and the second gate conductor to a respective voltage.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

The FIGS. are not to scale and illustrate example processing steps for fabricating field effect transistors (FETs) having a double side gate assists in metal gate first process, according to various embodiments. FIGS. 1A-7B depict plan views of a processing step for the FET in the A FIGS. and vertical cross-sectional views of the corresponding step for the B FIGS.

FIG. 1A depicts a plan view of a semiconductor device at an initial processing step, according to various embodiments.

FIG. 2A depicts a plan view of the semiconductor device after a processing step, according to various embodiments.

FIG. 2B depicts a vertical cross-sectional view of the semiconductor device of FIG. 2A along plane A-A', according to various embodiments.

FIG. 3A depicts a plan view of the semiconductor device after a processing step, according to various embodiments.

FIG. 3B depicts a vertical cross-sectional view of the semiconductor device of FIG. 3A along plane A-A', according to various embodiments.

FIG. 6A depicts a plan view of the semiconductor device after a processing step, according to various embodiments FIG. 6B depicts a vertical cross-sectional view of the semiconductor device of FIG. 6A along plane A-A', according to various embodiments.

FIG. 7B depicts a vertical cross-sectional view of the semiconductor device of FIG. 7A along plane A-A', according to various embodiments.

Figure 1A:
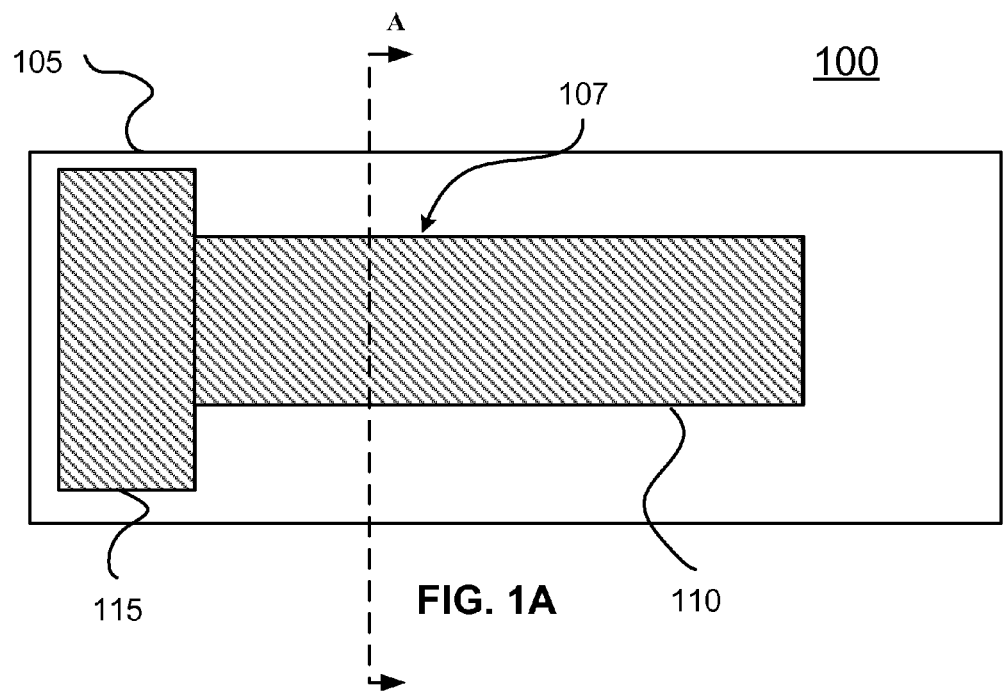

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

DETAILED DESCRIPTION

Aspects of the present disclosure relate to the data processing field, more particular aspects relate to a method and semiconductor device for implementing field effect transistors (FETs) having a side gate assist in metal gate first process. While the present disclosure is not necessarily limited to such applications, various aspects of the disclosure may be appreciated through a discussion of various examples using this context.

Embodiments provide for a semiconductor device containing a FET. There are at least two gates for the FET. A first gate is a gate conductor separated from a semiconductor substrate with an insulator. A second gate, also referred to as side gates, is a second gate conductor adjacent to the sides of the first gate. The second gate is separated from the first gate and the semiconductor substrate by an insulator. The first and second gates make up a gate region. The first gate has a first electrical contact for a voltage supply at one end of the gate region while the second gate has a second electrical contact for a voltage supply at the opposite end of the gate region of the semiconductor device. The gates may be formed in a metal-gate first process where the gates are formed before the source and drain regions are formed.

In the pursuit of reducing chip size, the typical approach has been to reduce the device size with each technology node and then deal with device size related performance issues such as leakage. Using conventional metal-gate first process, the process may not be sustainable beyond 22 nm as the semiconductor devices at this scale become leakier and more difficult to control, particularly in the off state. The variations across a given die have lead to power dissipation and delay variation issues. The use of typical power gating techniques to mitigate DC power issues require significant physical area and lead to power supply distribution issues as all power must be sourced through the power gating transistors and those transistors dissipate a material subset of the power supply they are gating when large current is present.

Various embodiments herein may reduce physical area and power dissipation issues to power gate small sections of the die. Various embodiments may use the metal-gate first construction process, but reduce the chip size by constructing adjacent devices besides the standard gate. The adjacent devices, referred to as side gates herein, may be utilized logically or for power gating even at a single transistor level. The side gates may serve several purposes. For example, the side gates can be independently turned on ahead of the main center gate to pre-bias it so that the main gate can turn on/off quicker while having lower leakage while the assist side gates are off. Another example, side gates can be utilized as power control to disable logic functions on a very granular level. The device may not turn on when the logical input is switched when the assist gate is gated. In another function, the side gates could be utilized independent of the main center gate to be connected up and perform logic AND functions. In another example, the side gates could be biased to some intermediate voltage allowing for power/performance tuning of individual gates or groups of gates.

FIG. 1A depicts a plan view of a semiconductor device 100 at an initial processing step, according to various embodiments. The process may begin with a semiconductor device 100 which may have a deposited and defined gate stack on a semiconductor substrate 105. The gate stack may be referred to as gate region 107. The semiconductor substrate 105 may be a P– silicon substrate of a bulk substrate wafer or a substrate above a buried oxide layer of a silicon-on-insulator (SOI) wafer. The P– doped semiconductor substrate 105 may be an oppositely doped substrate (N+) or N– Si substrate may be used. In various embodiments, the semiconductor substrate 105 may be other appropriate semiconducting materials, including, but not limited to, SiC, Ge alloys, GaP, InAs, InP, SiGe, GaAs, other III/V or II-VI compound semiconductors, or other crystalline structures.

Figure 1B:
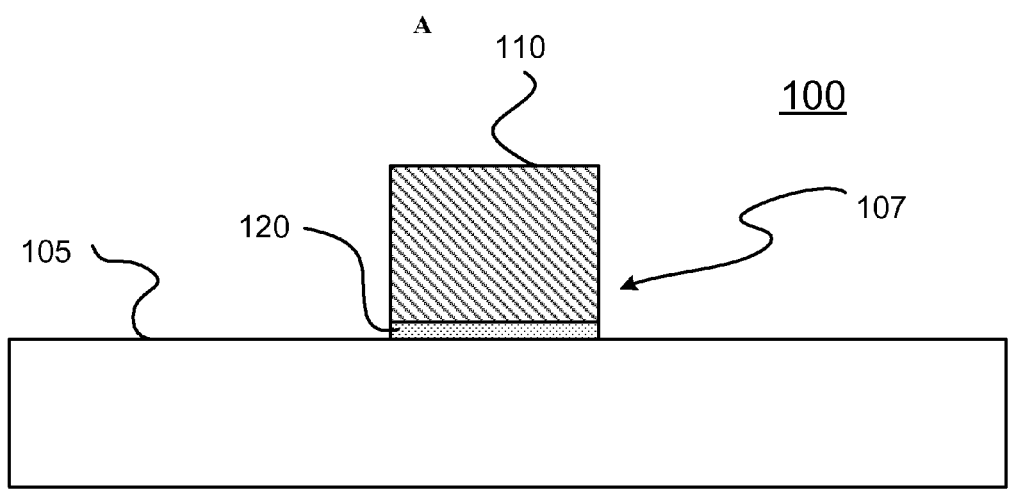
FIG. 1B depicts a vertical cross-sectional view of the semiconductor device of FIG. 1A along plane A-A', according to various embodiments.

The gate region 107 may include a first gate conductor 110 and a first insulator 120 as shown in FIG. 1B. The gate region 107 may be deposited on a surface of the semiconductor substrate 105. The first insulator 120 may be between the first gate conductor 110 and the semiconductor substrate 105. The first insulator 120 may electrically isolate the semiconductor substrate 105 from the first gate conductor 110. The first insulator 120 may be a high-K dielectric (where κ is the dielectric constant) such as hafnium dioxide $HfO_2$; however, other dielectrics such as $Si_3N_4$ or $SiO_2$ may be used. The first gate conductor 110 may be polysilicon, or other conductive metals such as, but not limited to, W, Ti, Ta, Cu, or Al. A first electrical contact 115 may be formed on one of the ends of the gate region 107. The electrical contact 115 may be formed for electrically connecting the first gate conductor 110 to a first voltage supply.

FIG. 1B depicts a vertical cross-sectional view of the semiconductor device 100 along plane A-A', according to various embodiments. The view illustrates the semiconductor device 100 having the semiconductor substrate 105 with the first insulator 120 deposited between the semiconductor substrate 105 and the first gate conductor 110. The first gate conductor 110 and the first insulator 120 may make up the gate region 107.

FIG. 2A depicts a plan view of a semiconductor device 100 after a processing step, forming semiconductor device 200, according to various embodiments. The processing step forming semiconductor device 200 includes depositing a second insulator 225 over the semiconductor device 100 of FIG. 1. The second insulator 225 may be a high-K dielectric such as, but not limited to, $HfO_2$.

In accordance with various embodiments, a first gate is formed of the first gate conductor 110 and a second gate is formed in proceeding processing steps of a second gate conductor with the second insulator 225 separating the first gate conductor 120 and the second gate conductor 330 as shown in FIGS. 3-7. The thickness of the second insulator 225 as well as the first insulator 120 may be only a few nanometers thick such as 1-3 nm. The type of insulator material to use may depend on the thickness of the insulators which may affect the gate capacitance. The drive current of a FET may be proportional to the gate capacitance. The greater the drive current may raise the performance of the FET. The gate capacitance may be modeled by the equation:

$$C = \kappa \epsilon_0 A/t$$

The relative dielectric constant of the dielectric material is κ. Insulator $SiO_2$ has a dielectric constant of 3.9 while $HfO_2$ has a dielectric constant of 25. The permittivity of free space is $\epsilon_0$. The width and the length of the gate region 107 may be the area, A. The thickness of the insulators is t. Having a higher-κ dielectric may allow for a thicker layer of first and second insulator to get a higher or similar gate capacitance than that of a low-κ dielectric. If the dielectric is too thin, current leakage from gate conductors and the substrate may occur.

FIG. 2B depicts a vertical cross-sectional view of the semiconductor device 200 along plane A-A', according to various embodiments. The semiconductor substrate 105 may be separated from the gate conductor 110 by the first insulator 120. The gate conductor 110 and the first insulator 120 may form the gate region 107. The second insulator 120 may be deposited on over the exposed surfaces of a side of the semiconductor device 100 that has the gate region 107. The second insulator 120 may cover surfaces of the gate region 107 and the semiconductor substrate 105.

FIG. 3A depicts a plan view of a semiconductor device 200 after a processing step, forming semiconductor device 300, according to various embodiments. The processing step forming semiconductor device 300 includes depositing a second gate conductor 330 over the semiconductor device 200. The second gate conductor 330 may be a polysilicon spacer or other conductive metals such as, but not limited to, W, Ti, Ta, Cu, or Al.

FIG. 3B depicts a vertical cross-sectional view of the semiconductor device 300 along plane A-A', according to various embodiments. The semiconductor substrate 105 may be separated from the first gate conductor 110 by the first insulator 120. The first gate conductor 110 and the first insulator 120 may form the gate region 107. The second insulator 225 may cover surfaces of the gate region 107 and the semiconductor substrate 105. The second gate conductor 330 may be deposited over second insulator 225.

Figures 4A, 4B:
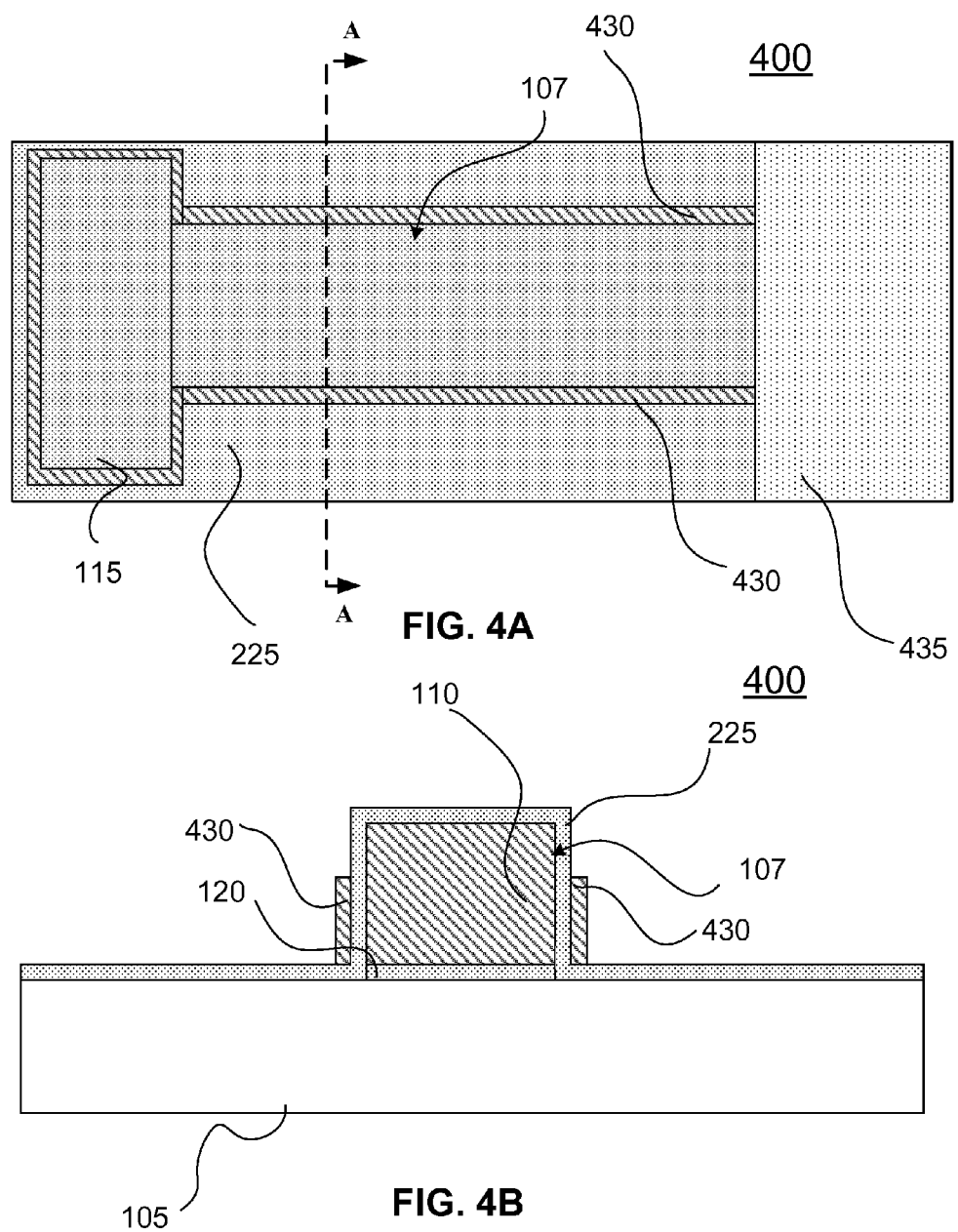
FIG. 4A depicts a plan view of the semiconductor device after a processing step, according to various embodiments
FIG. 4B depicts a vertical cross-sectional view of the semiconductor device of FIG. 4A along plane A-A', according to various embodiments.

FIG. 4A depicts a plan view of a semiconductor device 300 after a processing step, forming semiconductor device 400, according to various embodiments. The processing step forming semiconductor device 400 may include adding dielectric mask 435 to one end of the semiconductor device 300, and performing an anisotropic etch of the remaining exposed second gate conductor 330 of FIG. 3, thereby forming a second gate conductor 430 adjacent to the second insulator 225. The dielectric mask 435 may be formed at the end of the semiconductor device 400 that is opposite the end of the semiconductor device 400 that has the first electrical contact 115. The dielectric mask 435 may be used to mask the second gate conductor 430 at the end of the second gate to form a second electrical contact for the second gate in subsequent processing steps. The anisotropic etch may remove the thickness of the second gate conductor 330 (FIG. 3) on the horizontal surfaces of the semiconductor device 300 leaving the second gate conductor 330 on the vertical surfaces of the semiconductor device 300. The remaining second gate conductor is denoted by reference number 430.

FIG. 4B depicts a vertical cross-sectional view of the semiconductor device 400 along plane A-A', according to various embodiments. The second gate conductor 430 may remain on the vertical sides of the second insulator 225. In various embodiments, as illustrated in FIG. 4B, the anisotropic etch may be an over etch. The over etch may remove a top portion of the second gate conductor 330 on the vertical sides of the gate region 107. The height of the second gate conductor 430 may be less than the height of the second insulator 225 and less than the height of the first gate conductor 110. The over etching of the second gate conductor may be performed to reduce the capacitance between the first gate conductor 110 and the second gate conductor 430. The dielectric mask 435 is omitted from FIG. 4B for clarity purposes.

Figure 5A:
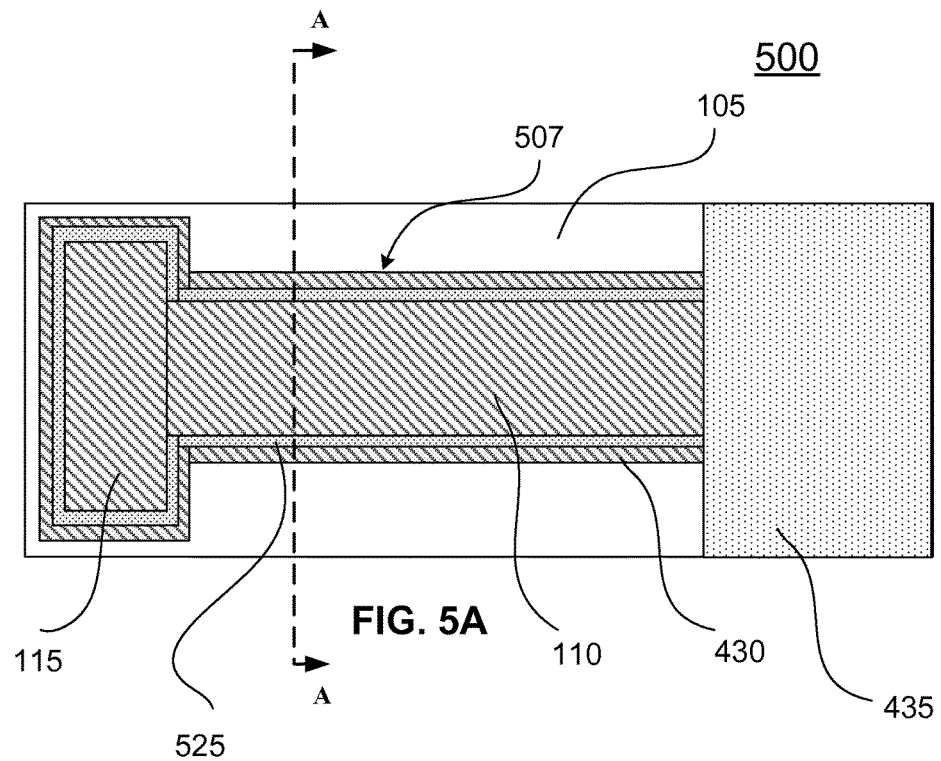
FIG. 5A depicts a plan view of the semiconductor device after a processing step, according to various embodiments

FIG. 5A depicts a plan view of a semiconductor device 400 after a processing step, forming semiconductor device 500, according to various embodiments. An anisotropic etch of the second insulator 225 of FIGS. 4A and 4B may be performed, thereby forming second insulator 525. The second insulator 225 may be removed from all of the horizontal surfaces of the semiconductor device 400 leaving the second insulator 525 on all of the vertical surfaces. Also, the dielectric mask 435 may not be etched and remain part of semiconductor device 500. The gate region referenced 507 is now defined as the second gate conductor 430, the second insulator 525, the first gate conductor 110, and the first insulator 120. The second gate conductor 430 and the second insulator 525 make up the second gate while the first gate conductor 110 and the first insulator 120 make up the first gate.

Figure 5B:
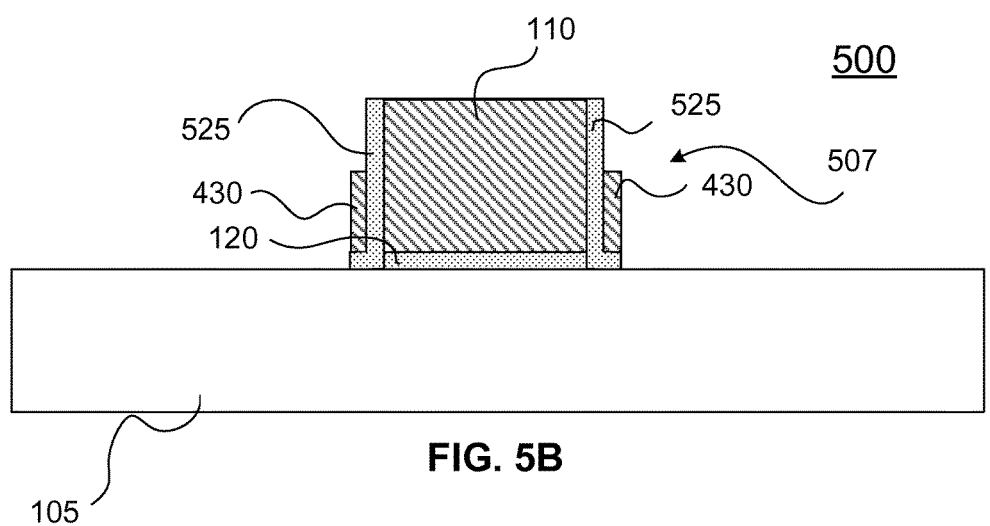
FIG. 5B depicts a vertical cross-sectional view of the semiconductor device of FIG. 5A along plane A-A', according to various embodiments.

FIG. 5B depicts a vertical cross-sectional view of the semiconductor device 500 along plane A-A', according to various embodiments. As previously discussed, the second insulator 225 of FIGS. 4A and 4B may be etched from the horizontal surfaces of semiconductor device 400 leaving the second insulator 525 on the vertical surfaces of the semiconductor device 500. The anisotropic etch may leave the second insulator 525 on the horizontal surface below the second gate conductor 430, insulating the second gate conductor 430 from the semiconductor substrate 105 and the first gate conductor 110.

FIG. 6A depicts a plan view of a semiconductor device 500 after a processing step, forming semiconductor device 600, according to various embodiments. The processing step may include adding an insulator spacer 640 over the semiconductor device 500 of FIGS. 5A and 5B and performing an anisotropic dielectric etch of the insulator spacer 640. The remaining insulator spacer 640 may cover and electrically insulate the second gate conductor 430. As is shown in the vertical cross-sectional view of the semiconductor device 600 along plane A-A', the insulator spacer 640 may be on a top surface and a side surface of the second gate conductor 430. The first gate conductor 110 may be exposed on its top surface. The insulator spacer 640 may be a low-κ dielectric such $SiO_2$ though other insulators may be used.

Figure 7A:
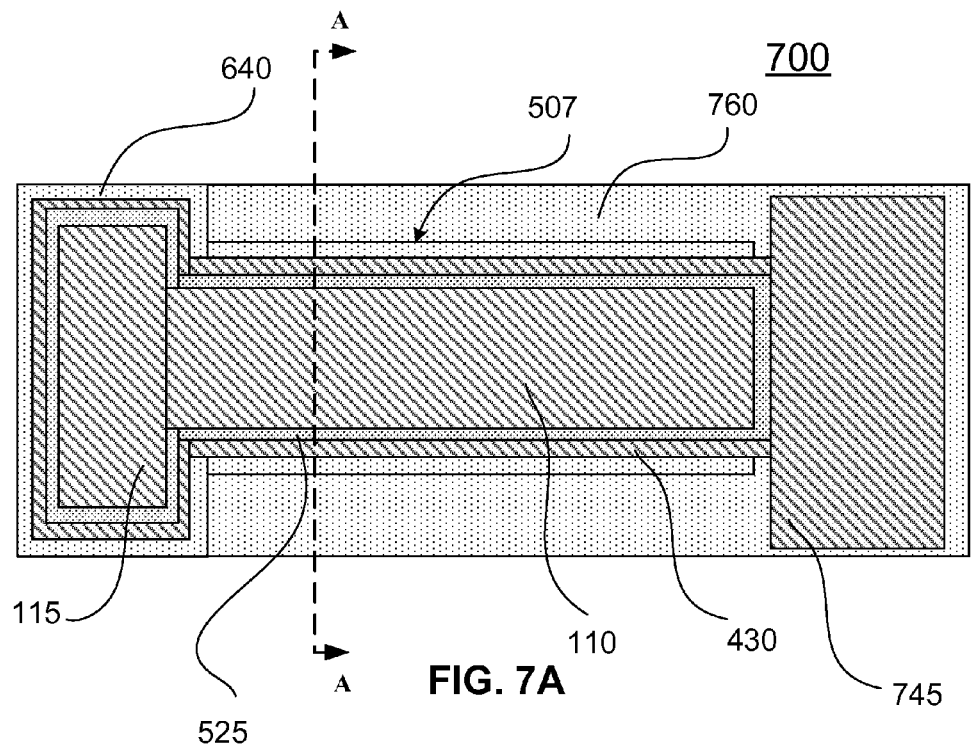
FIG. 7A depicts a plan view of the semiconductor device after a processing step, according to various embodiments

FIG. 7A depicts a plan view of a semiconductor device 600 after a processing step, forming semiconductor device 700, according to various embodiments. The processing step may include removing the dielectric mask 435 from the end of the gate region 507. The removal of the dielectric mask 435 may expose a second electrical contact 745 that may be connected to a second voltage supply for the second gate conductor 430. It is to be understood that the second gate conductor 430 is beneath the insulator spacer 640 (as shown in FIGS. 6A and 6B). The second gate conductor 430 is visible in FIG. 7A to show the connection between the second electrical contact 745 and the second gate conductor 430. The first electrical contact 115 may be electrically coupled to the first gate conductor 110 supplying the first gate conductor 110 with a first voltage supply. A planarization dielectric layer 760 may also be formed on the semiconductor device 700 to electrically insulate the components of the semiconductor device 700.

Figure 7B:
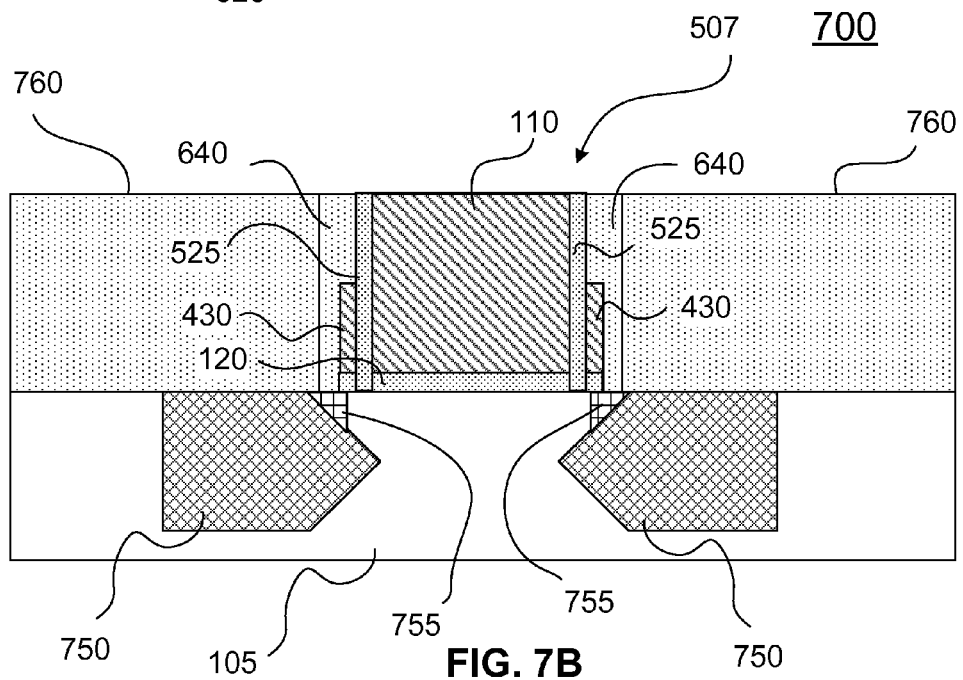

FIG. 7B depicts a vertical cross-sectional view of the semiconductor device 700 along plane A-A', according to various embodiments. During the process step of removing the dielectric mask 435, processing steps to form the FET in a metal gate first process may be performed by processing steps known to those skilled in the art. The FET of the semiconductor device 700 may include a diffusion edge of an extension 755, and a source and drain (S/D) 750 formed in the semiconductor substrate 105. The extension 755 may be a light implant. The source and drain (S/D) 750, for example, may be formed of a silicon germanium. A planarization dielectric layer 760 may also be formed on the semiconductor device 700 to electrically insulate the components of the semiconductor device 700 after the source and drain have been formed. In other various embodiments, the formation of the source/drain 750 and the extension 755 may be completed as early as the processing steps of FIG. 5 and FIG. 6.

Figure 8:
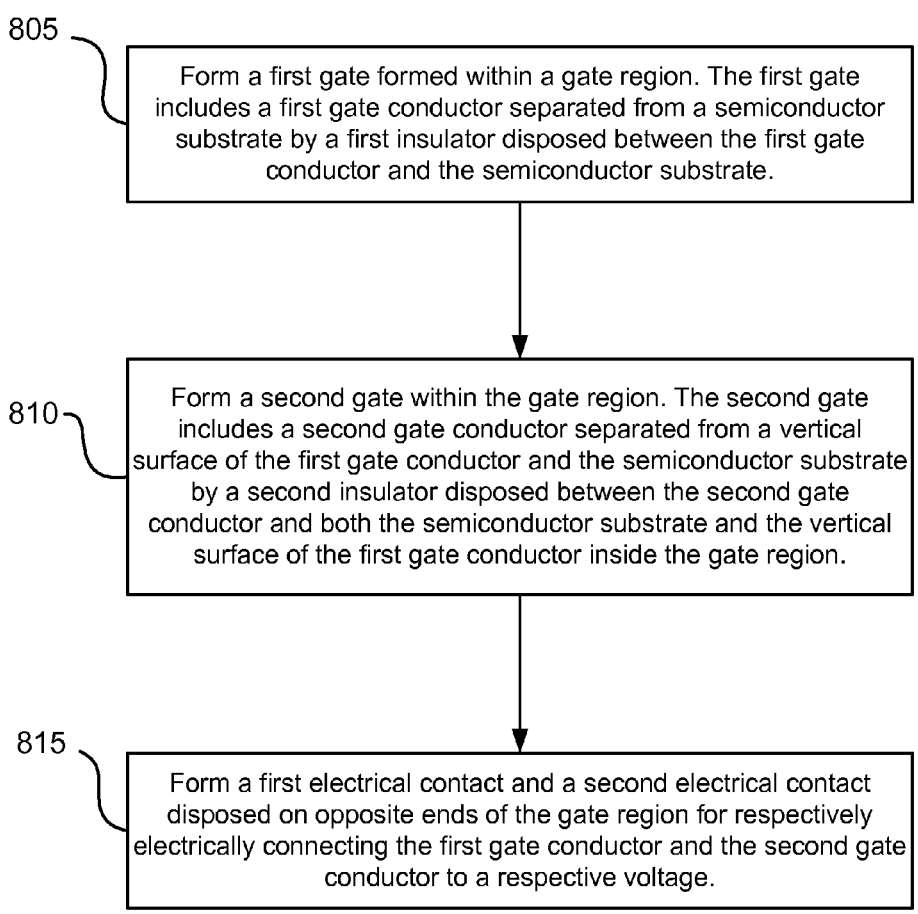
FIG. 8 depicts a flowchart of a method of making the semiconductor device of FIGS. 7A and 7B, according to various embodiments.

FIG. 8 depicts a flowchart of a method 800 of making the semiconductor device, according to various embodiments. In operation 805, a first gate may be formed within a gate region. The first gate may include a first gate conductor separated from a semiconductor substrate by a first insulator disposed between the first gate conductor and the semiconductor substrate. In operation 810, a second gate may be formed within the gate region. The second gate may include a second gate conductor separated from a vertical surface of the first gate conductor and the semiconductor substrate by a second insulator disposed between the second gate conductor and both the semiconductor substrate and the vertical surface of the first gate conductor inside the gate region. In operation 815, a first electrical contact and a second electrical contact may be formed. The first and second electrical contacts may be disposed on opposite ends of the gate region for respectively connecting the first gate conductor and the second gate conductor to a respective voltage.

Figure 9:
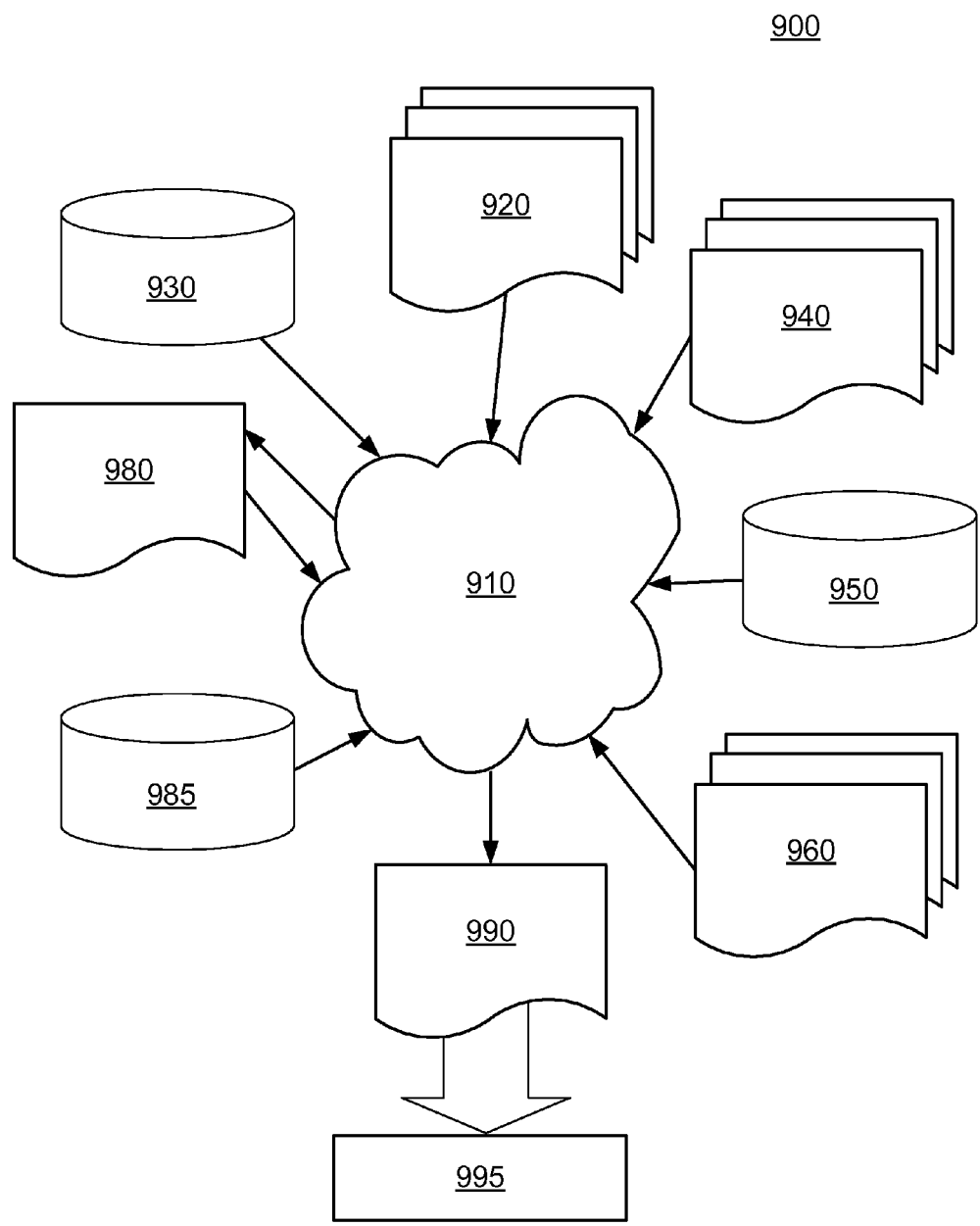
FIG. 9 depicts a flow diagram of a design process used in semiconductor design, manufacture, and/or test, according to various embodiments.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1A-FIG. 7B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1A-FIG. 7B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1A-FIG. 7B to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 22 nm, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1A-FIG. 7B. In one embodiment, design structure 990 may comprise a compiled, executable HDL simulation model that functionally simulates the devices shown in FIG. 1A-FIG. 7B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1A-FIG. 7B. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for making a semiconductor device that implements a field effect transistor (FET) utilizing first gate process comprising:
    forming a first gate formed within a gate region, the first gate includes a first gate conductor separated from a semiconductor substrate by a first insulator disposed between the first gate conductor and the semiconductor substrate;
    forming a second gate within the gate region, the second gate includes a second gate conductor separated from a vertical surface of the first gate conductor and the semiconductor substrate by a second insulator disposed between and in contact with the second gate conductor and both the semiconductor substrate and the vertical surface of the first gate conductor inside the gate region;
    forming a first electrical contact and a second electrical contact disposed on opposite ends of the gate region and not electrically connected to each other, for respectively electrically connecting the first gate conductor and the second gate conductor to a respective voltage.

2. The method of claim 1, wherein the first insulator and the second insulator are formed of a high dielectric constant material.

3. The method of claim 2, wherein the high dielectric constant material includes hafnium dioxide ($HfO_2$).

4. The method of claim 1, wherein the semiconductor substrate includes a bulk substrate wafer.

5. The method of claim 1, wherein the semiconductor substrate includes a substrate above a buried oxide layer in a silicon-on-insulator (SOI) wafer.

6. The method of claim 1, further comprising:
    forming a source and a drain within the semiconductor substrate by a gate first process.

7. The method of claim 1, wherein a height of the second gate conductor with respect to the semiconductor substrate is less than a height of the first gate conductor.

8. A method of making a semiconductor device for implementing a field effect transistor (FET) utilizing first gate process comprising:
    forming a first gate within a gate region on a semiconductor substrate, the first gate having a first gate conductor separated from the semiconductor substrate by a first insulator;
    depositing a second insulator over and in contact with the first gate conductor and semiconductor substrate;
    depositing a second gate conductor over the second insulator;
    forming a second gate by etching the second gate conductor to a depth where the second gate conductor remains on a vertical surface of the second insulator layer, the first gate and second gate making up the gate region;
    etching the second insulator to a depth where the second insulator remains on the vertical surface of the first gate conductor and between the second gate conductor and the semiconductor substrate; and
    forming a first electrical contact and a second electrical contact disposed on opposite ends of the gate region and not electrically connected to each other, for respectively electrically connecting the first gate conductor and the second gate conductor to a respective voltage.

9. The method of claim 8, wherein the first insulator and the second insulator are formed of a high dielectric constant material.

10. The method of claim 9, wherein the high dielectric constant material includes hafnium dioxide ($HfO_2$).

11. The method of claim 8, wherein the semiconductor substrate includes a bulk substrate wafer.

12. The method of claim 8, wherein the semiconductor substrate includes a substrate above a buried oxide layer in a silicon-on-insulator (SOI) wafer.

13. The method of claim 8, further comprising:
    forming a source and a drain within the semiconductor substrate by a gate first process.

14. The method of claim 8, wherein a height of the second gate conductor with respect to the semiconductor substrate is less than a height of the first gate conductor.

* * * * *